United States Patent [19]
Ravi et al.

[11] Patent Number: 5,976,993
[45] Date of Patent: *Nov. 2, 1999

[54] METHOD FOR REDUCING THE INTRINSIC STRESS OF HIGH DENSITY PLASMA FILMS

[75] Inventors: K. V. Ravi, Atherton; Kent Rossman, San Jose; Turgut Sahin, Cupertino; Pravin Narwankar, Sunnyvale, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/623,445

[22] Filed: Mar. 28, 1996

[51] Int. Cl.$^6$ ........................................... H01L 21/02
[52] U.S. Cl. ..................... 438/788; 438/788; 438/729; 438/789; 427/579; 118/723 R; 118/723 I
[58] Field of Search ........................ 437/238, 225; 204/192.23; 438/695, 714, 723, 729, 788, 789, 404, 424; 427/579; 118/723 R, 723 I

[56] References Cited

U.S. PATENT DOCUMENTS

| | | | |
|---|---|---|---|
| 4,495,218 | 1/1985 | Azuma et al. | 427/53.1 |
| 4,732,761 | 3/1988 | Machida et al. | 438/695 |
| 4,851,370 | 7/1989 | Doklan et al. . | |
| 4,872,947 | 10/1989 | Wang et al. . | |
| 4,877,641 | 10/1989 | Dory | 427/38 |
| 5,000,113 | 3/1991 | Wang et al. . | |
| 5,314,724 | 5/1994 | Tsukune et al. . | |
| 5,319,247 | 6/1994 | Matsuura . | |
| 5,429,070 | 7/1995 | Campbell et al. . | |
| 5,444,207 | 8/1995 | Sekine et al. . | |
| 5,453,305 | 9/1995 | Lee . | |
| 5,710,486 | 1/1998 | Ye et al. | 315/111.21 |

FOREIGN PATENT DOCUMENTS

| | | | |
|---|---|---|---|
| 63-80538 | 4/1988 | Japan | H01L 21/31 |
| 2-216851 | 8/1990 | Japan | H01L 21/90 |
| WO 92/20833 | 11/1992 | WIPO . | |

OTHER PUBLICATIONS

Galiano M. et al., "Stress–Temperature Behavior of Oxide Films Used For Intermetal Dielectric Applications," 1992 Proceedings 9th International IEEE VLSI Multilevel Interconnection Conference, Santa Clara, California, British Library Serial No. 4551–700750, pp. 100–106, Jun. 9–10, 1992.

Mizuno Shinsuke et al., "Improved Gap–Filing Capability of Fluorine–Doped PECVD Silicon Oxide Thin Film," *Thin Solid Films*, vol. 279, pp. 82–86, (1996). No Month.

Musaka Katsuyuki et al., "Single Step Gap Filing Technology for Subhalf Micron Metal Spacings on Plasma Enhanced TEOS/$O_2$ Chemical Vapor Deposition System," Extended Abstracts of the 1993 International Conference on Solid State Devices, and Materials, Makuhari, pp. 510–512, (1993).

(List continued on next page.)

*Primary Examiner*—Charles Bowers
*Assistant Examiner*—Thanh Nguyen
*Attorney, Agent, or Firm*—Townsend & Townsendy & Crew

[57] ABSTRACT

A layer of reduced stress is formed on a substrate using an HDP-CVD system by delaying or interrupting the application of capacitively coupled RF energy. The layer is formed by introducing a process gas into the HDP system chamber and forming a plasma from the process gas by the application of RF power to an inductive coil. After a selected period, a second layer of the film is deposited by maintaining the inductively-coupled plasma and biasing the plasma toward the substrate to enhance the sputtering effect of the plasma. In a preferred embodiment, the deposited film is a silicon oxide film, and biasing is performed by application of capacitively coupled RF power from RF generators to a ceiling plate electrode and wafer support electrode.

21 Claims, 6 Drawing Sheets

OTHER PUBLICATIONS

Robles S. et al., "Effects of RF Frequency and Deposition Rates on The Moisture Resistance of PECVD TEOS–Based Oxide Films," *ECS Extended Abstracts,* The Electrochemical Society, Spring Meeting, St. Louis, Missouri, Abstract No. 129, Vol. 92–1, pp. 215–216, (May 17–22, 1992).

Webb Douglas A. et al., "Silicon Dioxide Films Produced by PECVD of TEOS and TMCTS," 10439 Proceedings of the Second International Symposium on Ultra Large Scale Integration Science and Technology, vol. 89, No. 9, ULSI Science and Technology 1989, Edited by D. M. Osburn and J. M. Andrews, Pennington, NJ, US, pp. 571–585, (1989).

Yu D. et al., "Step Coverage Study of Peteos Deposition for Intermetal Dielectric Applications," 1990 Proceedings Seventh International IEEE VLSI Multilevel Interconnection Conference, IEEE Catalog No. 90TH0325–1, Library of Congress No. 89–6444090, Santa Clara Marriott Hotel, Santa Clara, CA, pp. 166–172, (Jun. 12–13, 1990).

METHOD FOR REDUCING THE INTRINSIC STRESS OF HIGH DENSITY PLASMA FILMS

BACKGROUND OF THE INVENTION

The present invention relates to the deposition of dielectric layers during semiconductor substrate processing. More specifically, the present invention relates to a method and apparatus for controlling the intrinsic stress in deposited layers. The method of the present invention is particularly useful in reducing the intrinsic stress of silicon oxide layers deposited by high density plasma chemical vapor deposition (HDP-CVD) techniques, but may be also applied to silicon oxide layers formed using other deposition methods, as well as to the deposition of silicon nitride and other layers.

One of the primary steps in the fabrication of modern semiconductor devices is the formation of a thin film on a substrate by chemical reaction of gases. Such a deposition process is referred to as chemical vapor deposition (CVD). Thermal CVD processes supply reactive gases to the substrate surface where heat-induced chemical reactions take place to produce a desired film. The high temperatures at which some thermal CVD processes operate can damage metal layers on device structures. Plasma enhanced CVD (PECVD) processes, on the other hand, promote excitation and/or disassociation of the reactant gases by the application of radio frequency (RF) energy to a reaction zone proximate to the substrate surface, thereby creating a plasma of highly reactive species. The high reactivity of the released species reduces the energy required for a chemical reaction to take place and thus lowers the required temperature for such CVD processes.

The relatively low temperature of a PECVD process makes such a process suitable for the formation of insulating layers over deposited metal or polysilicon layers. One common film for such insulating layers (also referred to as dielectric layers) is silicon oxide. Silicon oxide films are well suited for use as dielectric layers because of their good electrical and physical properties.

Semiconductor device geometries have dramatically decreased in size since such devices were first introduced several decades ago. During that time, integrated circuits have generally followed the two year/half-size rule (often called "Moore's Law") which means that the number of devices which will fit on a chip doubles every two years. Today's semiconductor fabrication plants routinely produce devices with feature sizes of 0.5 microns or even 0.25 microns, and tomorrow's plants will be producing devices with even smaller feature sizes.

As feature sizes become smaller and integration density increases, it becomes important that certain film characteristics be kept within specified ranges. One such characteristic is the intrinsic stress level of the deposited films. Specifically, it is important that manufacturers of smaller geometry devices be able to control the stress level of deposited layers. Intrinsic stress levels above or below certain values may cause a substrate to bow or crack or to form voids or other defects. The reduction in feature size compounds this problem. Although the absolute stress (measured in dynes/cm$^2$ or dynes/cm$^3$) may be no greater, the reduction in feature size causes a reduction in the feature's ability to withstand a given amount of force.

Smaller feature sizes have resulted in increased aspect ratios (the ratio of a feature's height or depth to its width). The result is narrow spaces or "gaps" (e.g., the space between metal lines) which are difficult to fill using conventional CVD methods. A film's ability to completely fill such gaps is referred to as the film's "gap filling" ability.

Finally, some conventional CVD processes cause variations in deposition rates, according to the geometry of the underlying feature. Such phenomena can, create voids in the bottom of gaps (e.g., if the metal lines are close enough together, the deposited layer closes the top of the gap before the gap is completely filled). Given these problems, the electrical and physical characteristics of some silicon oxide films deposited using some standard PECVD methods are no longer sufficient for many contemporary applications.

A promising solution to improve gap filling properties is the use of HDP-CVD systems, which employ RF coils to generate an inductively coupled plasma under low-pressure conditions. The density of such a plasma is approximately two orders of magnitude or more greater than the density of a standard, capacitively coupled PECVD plasma. It is believed that the low chamber pressure employed in HDP-CVD systems provides active species having a long mean-free-path. This factor, in combination with the plasma's density, contributes to a significant number of constituents from the plasma reaching even the deepest portions of closely spaced gaps, providing a film with excellent gap filling capabilities. Also, an HDP plasma's high density promotes sputtering during deposition. It is believed that the sputtering element of HDP deposition slows deposition on certain features, contributing to the increased gap filling ability of HDP deposited films.

Some HDP-CVD systems introduce argon or a similar heavy inert gas to further promote the sputtering effect and provide better gap-fill characteristics for a given film. Some of these HDP-CVD systems and others employ capacitively coupled electrodes that create an electric field to bias the plasma toward the substrate. The electric field is initiated at the same time RF power is applied to the inductive coil and is maintained throughout the HDP deposition process. Such biasing can still further promote sputtering and provide better gap fill characteristics. The use of such HDP-CVD systems is therefore becoming increasingly important. For a variety of reasons not yet well understood, however, films created in such HDP-CVD systems exhibit higher stress than those created in conventional capacitively coupled PECVD systems. Controlling this increased stress is an important issue.

In the past, the stress in HDP films has been reduced by depositing a low-stress PECVD or other type of non-HDP film over the HDP film. This dual layer (high-stress/low-stress) approach allows for the intrinsic stress of HDP films to be controlled to within an acceptable range. Such an approach, however, also increases processing time and thus decreases throughput as substrates are transferred from an HDP-CVD system to a PECVD or other type of system. Even if deposition of the composite layer could take place in a single system, substrate throughput would still be adversely affected while process conditions such as pressure and temperature are adjusted for deposition of the two different layers. Accordingly, it is desirable to control and reduce the stress in silicon oxide and similar films formed by HDP-CVD and other processing techniques.

SUMMARY OF THE INVENTION

The present invention provides a method and apparatus for reducing the stress of films deposited by HDP-CVD processes without substantially increasing processing time or decreasing throughput. The reduced stress layer is formed by delaying or interrupting application of a field that biases an HDP plasma toward a substrate.

According to one embodiment of the method of the present invention, a process gas is introduced into a processing chamber and a plasma is formed from the process gas by the application of RF power to an inductive coil. The plasma is maintained for a selected time to deposit a first layer of a reduced-stress film over a substrate. After deposition of the first layer, the plasma is biased toward the substrate to enhance the sputtering effect of the plasma and deposit a second layer of the film over the substrate. In a preferred version of this embodiment, the deposited film is a silicon oxide film. In another preferred version of this embodiment, the plasma is biased by application of an electric field between capacitively coupled electrodes; and in still a further preferred embodiment, the first layer is deposited by maintaining the plasma for a period of between about 5–20 seconds before biasing the plasma toward the substrate.

In one embodiment of the apparatus of the present invention, a pedestal which holds a semiconductor substrate is located within a processing chamber. A gas distribution system introduces a process gas containing reactants into the vacuum chamber and sets and maintains a selected pressure in the chamber along with a vacuum pump and valve system. A plasma generation system creates an inductively coupled plasma from the process gas to form a first layer of the film being deposited. After deposition of the first layer, the plasma generation system further excites the plasma capacitively and biases the plasma toward the substrate. This enhances sputtering and forms the film's bulk layer. A processor controls the vacuum pump, gas distribution system and plasma generation system through a program stored in a connected memory.

In an alternative embodiment of the method of the present invention, a multilayer film is formed from multiple alternating layers deposited with and without application of an electric field to bias the plasma toward the substrate.

A further understanding of the nature and advantages of the present invention may be realized by reference to the remaining portions of the specification and the drawings.

DETAILED DESCRIPTION OF THE PREFERRED EMBODIMENTS

I. An Exemplary High Density Plasma CVD System

Figure 1:
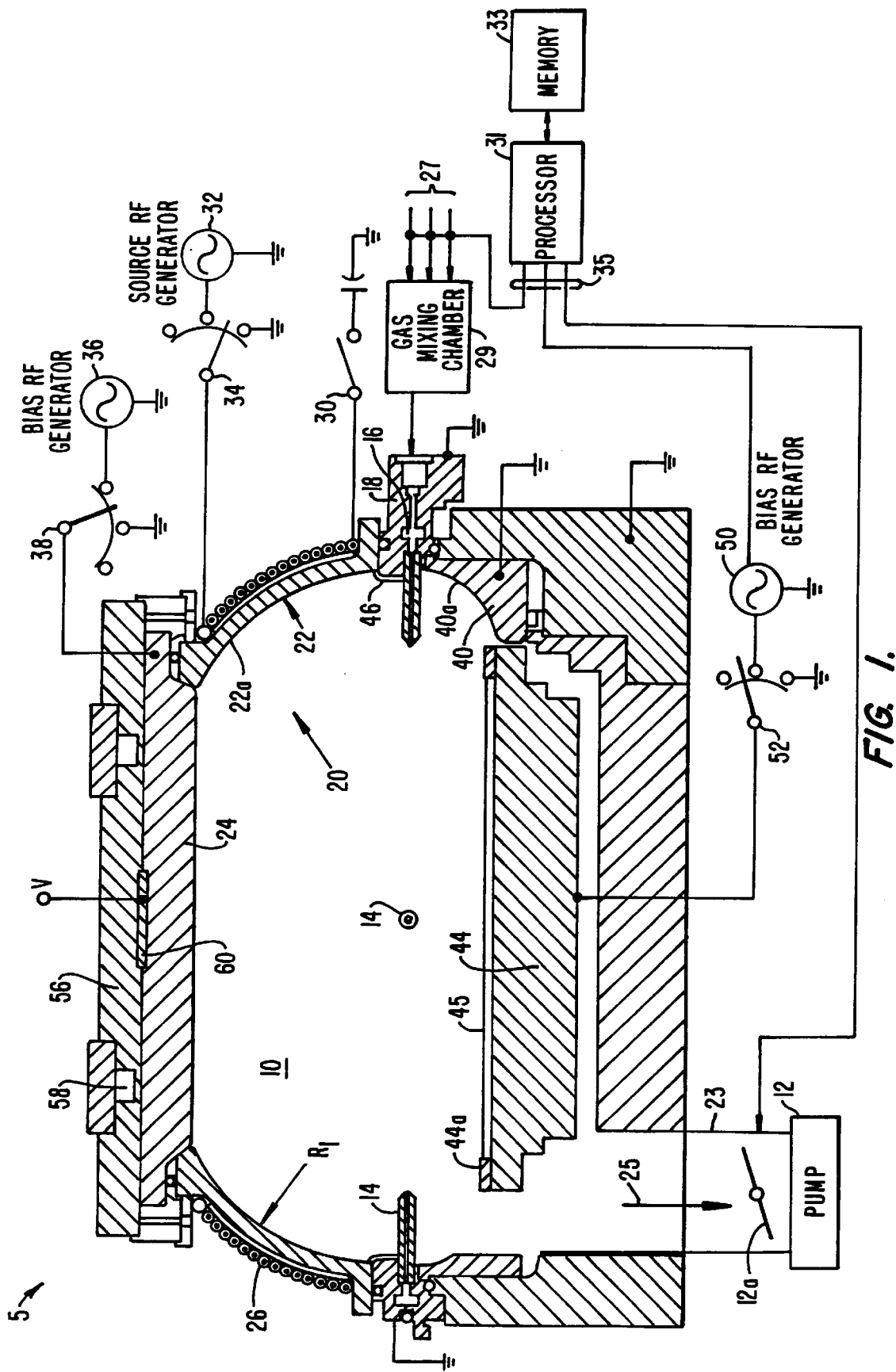
FIG. 1 is a vertical, cross-sectional view of one embodiment of a simplified HDP-CVD apparatus according to the present invention.

FIG. 1 illustrates one embodiment of an HDP-CVD system 5, capable of depositing a dielectric layer according to the present invention. HDP-CVD system 5 includes a vacuum chamber 10, a vacuum pump 12, a bias RF (BRF) generator 36, a BRF generator 50 and a source RF (SRF) generator 32.

Vacuum chamber 10 includes a ceiling 20 consisting of a sidewall 22 and a disk-shaped ceiling electrode 24. Sidewall 22 is made of an insulator such as quartz or ceramic and supports coiled antenna 26. The structural details of coiled antenna 26 are disclosed in U.S. patent application Ser. No. 08/113,776 entitled "High Density Plasma CVD and Etching Reactor," by Fairbain and Nowak, filed Aug. 27, 1993, the disclosure of which is incorporated herein by reference.

Deposition gases and liquids are supplied through lines 27, having control valves (not shown), into a gas mixing chamber 29 where they are combined and sent to a gas supply ring manifold 16. Gas injection nozzles 14 are coupled to gas supply ring manifold 16 and disperse deposition gases introduced into manifold 16 to a substrate 45 resting on a pedestal 44 within chamber 10. Pedestal 44 may contain an electrostatic chuck or similar mechanism to restrain the substrate during processing and may also contain cooling passages and other features.

Gas supply ring manifold 16 is positioned within a housing 18. Housing 18 is protected from reactants by a skirt 46. Skirt 46 is composed of a material, such as quartz, ceramic, silicon or polysilicon, which is resistant to the reactants used in the HDP-CVD process. The bottom of vacuum chamber 10 may include an annular liner 40, which itself may be made removable.

An inductively coupled plasma of the deposition gases can be formed adjacent to substrate 45 by RF energy applied to coiled antenna 26 from SRF generator 32. SRF generator 32 can supply either single or mixed frequency RF power (or other desired variation) to coiled antenna 26 to enhance the decomposition of reactive species introduced into vacuum chamber 10. Deposition gases are exhausted from chamber 10 through exhaust line 23 as indicated by arrow 25. The rate at which gases are released through exhaust line 23 is controlled by throttle valve 12a.

Ceiling electrode 24 is held in place by a lid 56. Lid 56 is cooled by cooling jackets 58, but ceiling electrode 24 can be heated by a resistive heater 60 to accelerate cleaning rates or alter process parameters. Ceiling electrode 24 is a conductor and may be connected to either ground, to a BRF generator 36, or left unconnected (allowed to float), by properly setting switch 38. Similarly, pedestal 44 may be connected to either ground, to a BRF generator 50 or left unconnected (allowed to float), by properly setting switch 52. The settings of these switches depends upon the plasma's desired characteristics. BRF generators 36 and 50 can supply either single or mixed frequency RF power (or other desired variation). BRF generators 36 and 50 may be separate RF generators, or may be a single RF generator connected to both ceiling electrode 24 and pedestal 44. Application of RF energy from BRF generators 36 and 50 to bias an inductively coupled plasma toward pedestal 44 promotes sputtering and enhances existing sputtering effects of the plasma (i.e., increasing the gap-fill capability of a film).

Capacitive coupling may also be used to form the plasma separately from, or in conjunction with, the formation of an inductively coupled plasma. Such a plasma may be formed between coiled antenna 26 and either ceiling electrode 24 or pedestal 44. A capacitively coupled plasma also may be formed between ceiling electrode 24 and pedestal 44 in a similar fashion. Together, these methods allow the formation of a capacitively coupled plasma in three different ways.

BRF generators 36 and 50, SRF generator 32, throttle valve 12a, the control valves connected to lines 27, switches 30, 34, 38 and 52 and other elements in HDP-CVD system 5 are all controlled by a processor 31 over control lines 35, only some of which are shown. Processor 31 operates under the control of a computer program stored in a memory 33. The computer program dictates the timing, mixture of gases, chamber pressure, RF power levels and other parameters of a particular process.

An example of such an HDP-CVD apparatus, along with the details of each of the three capacitively coupled configurations and the specific details concerning the inductively coupled configurations, is described in U.S. patent application Ser. No. 08/234,746 entitled "High Density Plasma CVD Reactor with Combined Inductive and Capacitive Coupling," filed Apr. 26, 1994, the disclosure of which is incorporated herein by reference.

The above description is mainly for illustrative purposes and should not be considered as limiting the scope of the present invention. Variations of the above described system, such as variations in pedestal design, chamber design, location of RF power connections and other variations are possible. Additionally, other CVD equipment such as electron cyclotron resonance (ECR) plasma CVD devices, thermal CVD devices or the like, may be employed. The method and apparatus of the present invention are not limited to any specific apparatus or to any specific plasma excitation method.

II. Silicon Oxide Deposition and Stress Control

The method of the present invention reduces the intrinsic stress of a film deposited in an HDP-CVD system by depositing the film using a two-step process. In the first step, a first portion of the film (the stress reduction layer or "SRL" for short) is deposited by formation of an HDP plasma through the application of RF energy to inductive coils. In the second step, the remainder of the film (the bulk layer) is deposited by maintaining the inductively coupled plasma and biasing the plasma toward the substrate to enhance sputtering. Importantly, the two-step deposition process of the present invention does not require additional processing time. It requires only that RF energy applied to bias the plasma toward the substrate be withheld for a brief period to form the SRL, and then be applied to increase the film's gap fill capability.

In the exemplary HDP-CVD system described above, one embodiment of the method of the present invention deposits an SRL by energizing coiled antenna 26 (via SRF generator 32) without energizing either pedestal 44 or ceiling electrode 24 to form an inductive plasma from the process gas. After a relatively brief period, the plasma is further energized and biased toward a substrate by capacitively coupling RF energy from BRF generators 50 and 36 via pedestal 44 and ceiling electrode 24, respectively. This completes the deposition of the SRL and deposits the film's bulk layer.

Figure 2:
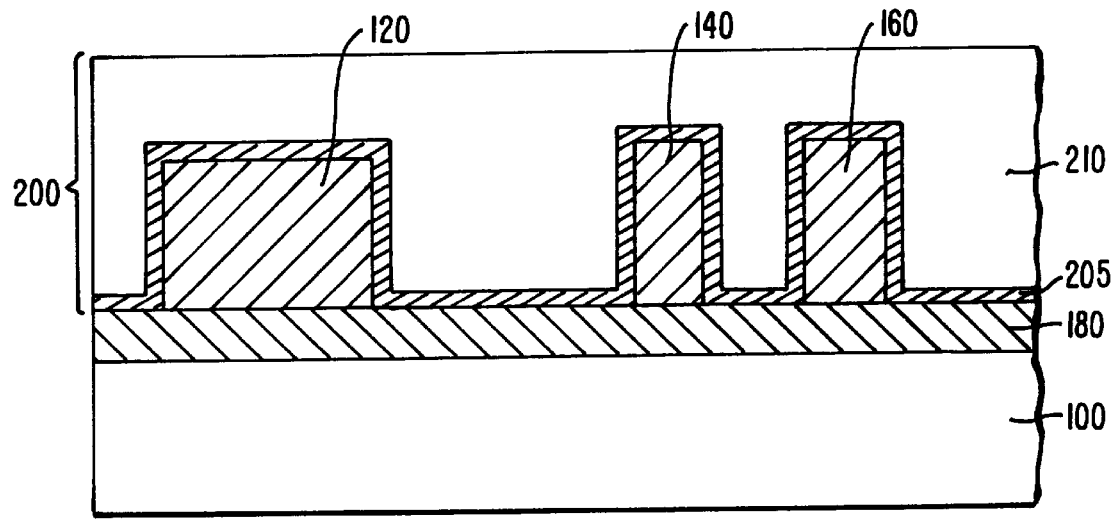
FIG. 2 is a simplified cross-sectional view of a silicon oxide film deposited on a substrate according to one embodiment of the process of the present invention.

FIG. 2 shows a simplified cross-sectional view of a silicon oxide film 200 deposited on a substrate according to one embodiment of the method of the present invention. In the structure illustrated in FIG. 2, active devices (not shown) are formed in a substrate 100 using a well-known fabrication process such as a self-aligned CMOS or similar process. A metal layer, including metal lines 120, 140 and 160, is deposited over substrate 100 to connect the active devices through contact openings (not shown). A dielectric layer 180 prevents the metal layer from contacting substrate 100 except where contact openings are formed. Silicon oxide film 200 is deposited over and between metal lines 120, 140 and 160 to electrically insulate the lines from subsequently deposited metal lines or other layers. Silicon oxide film 200 includes a first, thin, stress reduction layer 205 and a second, bulk film layer 210. SRL 205 is formed under HDP plasma conditions without the application of a bias RF field to promote and enhance the sputtering element of the HDP plasma. After formation of SRL 205 is complete, layer 210 is formed in the standard HDP-CVD manner of biasing the inductively coupled plasma toward the substrate with the application of an electric field between capacitively coupled ceiling electrode 24 and pedestal 44.

For deposition of a 1.0 micron thick insulation layer, SRL 205 is typically deposited to a thickness of between about 0.01–0.15 microns and more typically to about 0.02–0.05 microns, depending on the desired film properties. Thicker or thinner SRLs are possible. A thicker SRL tends to have more salutary effects on the intrinsic stress of silicon oxide film 200, but for each different process there is a point at which gap filling ability is traded for stress reduction.

The time to complete step 210 compared to step 205 depends on the relative thickness and the deposition rate of each deposited layer in a given application. Generally, the deposition rate of each layer is about the same unless other processing conditions other than the application of a bias RF field are varied. In one exemplary process, step 210 is about 6–50 times longer than step 205 (depending on the desired thickness of the SRL) when a single SRL is deposited, and preferably about 10–50 times longer. In this process, the application of bias RF power is delayed for between 5–20 seconds while the SRL is deposited in step 205. In other processes, the application of bias RF power can be delayed for between 1–100 seconds or more.

Several sources of intrinsic stress exist in layers formed by an HDP-CVD process. It is believed that the two most prominent ones are caused by the process' sputtering component. The ion-bombardment (i.e., sputtering) aspect of the HDP-CVD process creates intrinsic stress by causing dislocation defects and replacement defects (by argon atoms, for example) in bulk layer 210. It is believed SRL 205 acts as a buffer layer to reduce stress from these phenomena by providing a high-quality (i.e., low defect count) foundation upon which bulk layer 210 is deposited. The second cause of stress is due to thermal expansion mismatch at the interface between bulk layer 210 and underlying layers. Again, it is believed that SRL 205 acts as a high-quality intermediate layer (having not been subjected to sputtering), allowing a smoother transition between the thermal expansion coefficients of the two materials.

Figure 3:
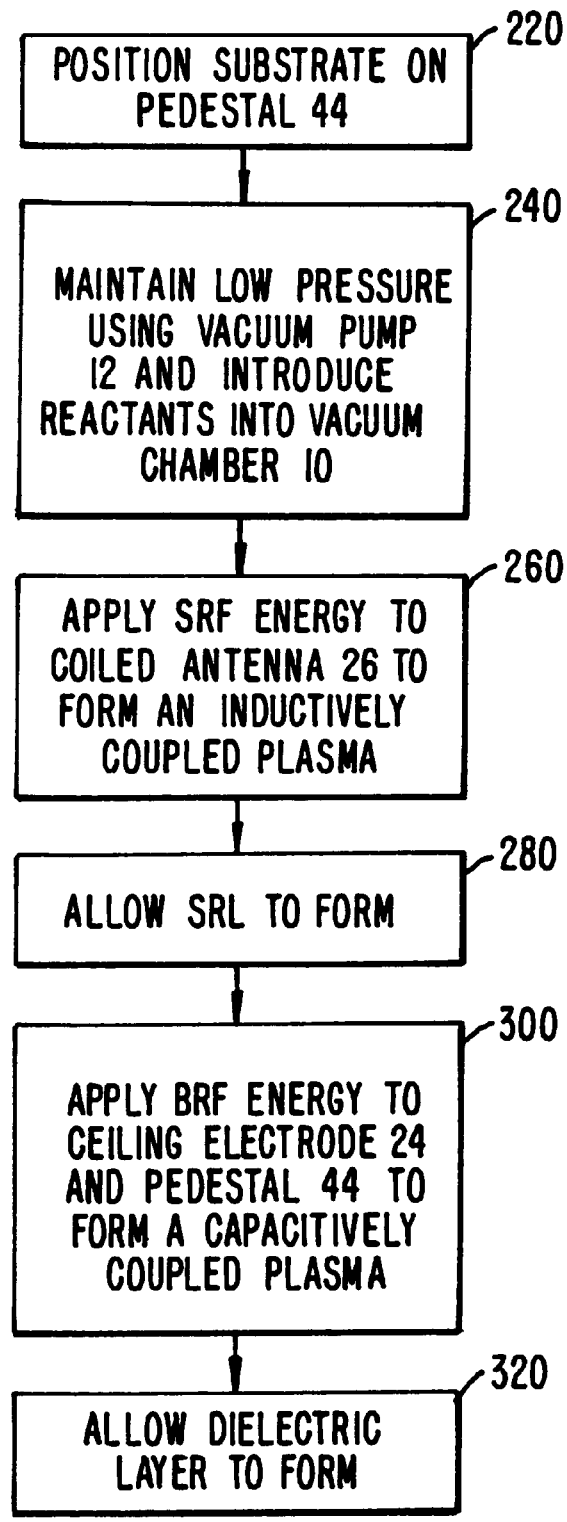
FIG. 3 is a flowchart illustrating steps undertaken in formation of the silicon oxide film deposited in FIG. 2.

FIG. 3 illustrates a preferred process of the invention with cross-reference numerals to the apparatus as shown in FIG. 1. According to one embodiment of the present invention, to form silicon oxide layer 200 the substrate is loaded in vacuum chamber 10 through a vacuum-lock door (not shown) and placed onto pedestal 44 (FIG. 3, step 220). Once the substrate is properly positioned, a process gas is introduced into vacuum chamber 10 from gas injection nozzles 14 (step 240). The process gas is a mixture comprising a gaseous source of silicon and one or more gaseous sources of oxygen. Additionally, the process gas may include a gaseous source of a heavy inert gas to enhance sputtering during deposition.

In a preferred embodiment, the gaseous mixture consists of a silicon-containing gas such as silane ($SiH_4$), an oxygen-containing gas such as oxygen ($O_2$) and argon or a similar gas as an additional constituent. Silane is introduced into vacuum chamber 10 at a rate of between about 10 to 50 sccm, and most preferably at a rate of about 20 sccm. Oxygen is introduced into the chamber at a rate of between about 20 to 100 sccm, and most preferably at a rate of about 48 sccm. Argon is introduced at a rate of between about 10 to 50 sccm, and most preferably at a rate of about 20 sccm. The total gas flow into vacuum chamber 10 through gas injection nozzles 14 is between about 40 and 200 sccm.

A selected pressure between about 1 millitorr to 10 torr (preferably about 1–25 millitorr and most preferably between about 4–7 millitorr) in vacuum chamber 10 is maintained throughout deposition by throttle valve 12a in conjunction with vacuum pump 12, and the introduction of the process gas (step 240). Also, the temperature within chamber 10 and maintained at between 100–500 degrees Celsius (preferably between about 200–425° C., and most preferably between 375–400° C.).

After processing conditions are set, RF energy is applied to coiled antenna 26 by SRF generator 32 to form an inductive plasma (step 260). SRF generator 32 continues to apply RF energy to coiled antenna 26 throughout this process. SRF generator 32 is driven at a frequency of 2 Mhz at between about 1000–4500 Watts, but preferably at about 3500 Watts. Maintaining the plasma for a selected period under these conditions results in the formation of the SRL (step 280). It is important to note that RF energy is not applied to either ceiling electrode 24 or pedestal 44 to bias the plasma toward the substrate during this period. Subsequently, in step 300, the plasma is biased toward the substrate and further excited by capacitively coupling RF energy from BRF generators 36 and 50 to ceiling electrode 24 and pedestal 44. Preferably, BRF generators 36 and 50 are a single RF generator coupled to both ceiling electrode 24 and pedestal 44. BRF generators 36 and 50 are driven at a frequency of 1.8 Mhz at between about 500–2000 Watts, but preferably at about 1000 Watts. The application of RF energy between ceiling electrode 24 and pedestal 44 creates a capacitively-coupled electric field that increases ion bombardment toward the ceiling and the pedestal. The increased ion bombardment toward pedestal 44 enhances sputtering thereby allowing the growing film (step 320) to better fill closely-spaced gaps. Other frequencies and power levels may also be used to bias the plasma toward the substrate.

Other silicon sources, such as tetramethyl silane (Si(CH$_3$)$_4$), hexamethyl disiloxane ((CH$_3$)$_6$OSi$_2$), TEOS (Si (OC$_2$H$_5$)$_4$) or the like, and other oxygen sources, such as ozone, N$_2$O or the like, may be used to form an SRL according to the present invention. Furthermore, the parameters listed in the above process should not be viewed as limiting the claims as described herein. One of ordinary skill in the art may also use other chemicals, environmental parameters and conditions.

In effect, the method of the present invention reduces the intrinsic stress of films deposited in an HDP-CVD system by depositing the SRL without the enhanced sputtering. The sputtering, in part, gives the bulk layer its excellent gap filling properties, but also increases the intrinsic stress to which the bulk layer is subjected. The method has the benefit of reducing intrinsic stress in the deposited layer, yet is a simple approach that allows in situ deposition of the SRL in the HDP-CVD system and that does not employ dopants to reduce stress. Also, while lower temperatures may be employed to reduce stress, the present method does not require longer processing times or altered silicon oxide film characteristics that may result from use of lower processing temperatures.

The method of the present invention, however, is not limited to an in situ process. For the first step of a non-in situ process, the SRL is deposited in a first CVD system (i.e., a non-HDP-CVD system). After deposition of the SRL, the semiconductor substrate is transferred to a second chamber in which the bulk of the subsequent film is deposited under HDP-CVD processing conditions.

Figure 4:
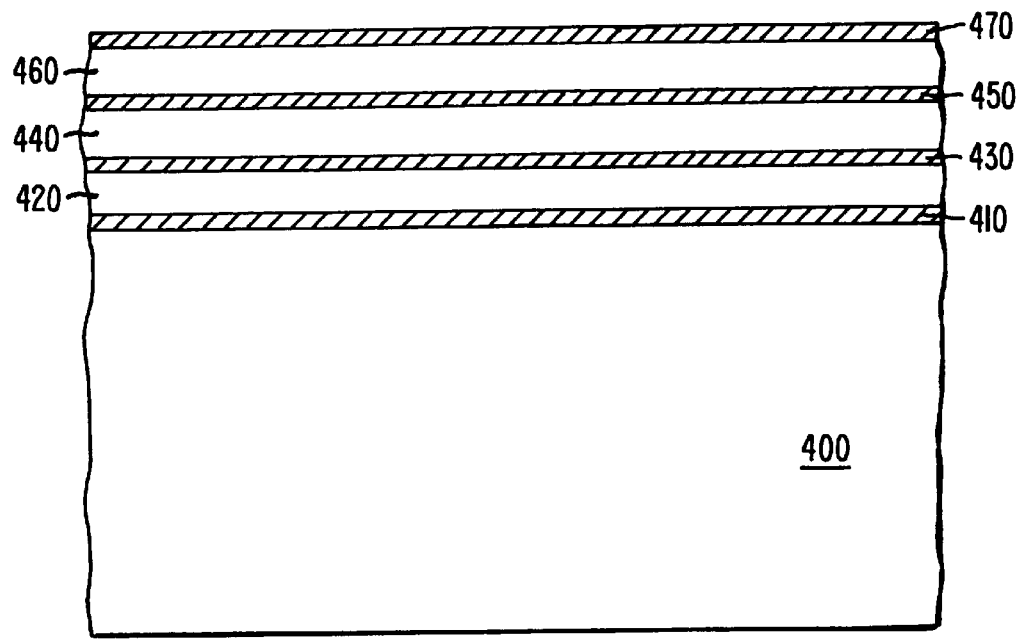
FIG. 4 is a simplified cross-sectional view of a silicon oxide film deposited on a substrate according to a second embodiment of the process of the present invention.

In another embodiment of the present invention, multiple alternating SRL and bulk layers are deposited, thereby forming a "sandwich" film. An example of an insulation layer deposited according to this embodiment is illustrated in FIG. 4. FIG. 4 illustrates where bulk layers 420, 440 and 460 are "sandwiched" between SRLs 410, 430, 450 and 470 in a film deposited in this manner. This permits more accurate control of the stress level than in the deposition process employing only an initial SRL. This "alternating chemistry" process may also enable an increase in the net deposition rate by periodically providing a new nucleation surface (an SRL) for each bulk layer. In this embodiment of the present invention, the thickness of SRLs 410, 430, 450 and 470 depend on the overall thickness of the film and the desired stress level of the film. As before, thicker SRL layers provide more stress reduction than thinner layers, but may adversely effect gap-fill characteristics if too thick. SRL layers 410, 430, 450 and 470 all may be substantially the same thickness or may vary in thickness as appropriate for a given application.

Figure 5:
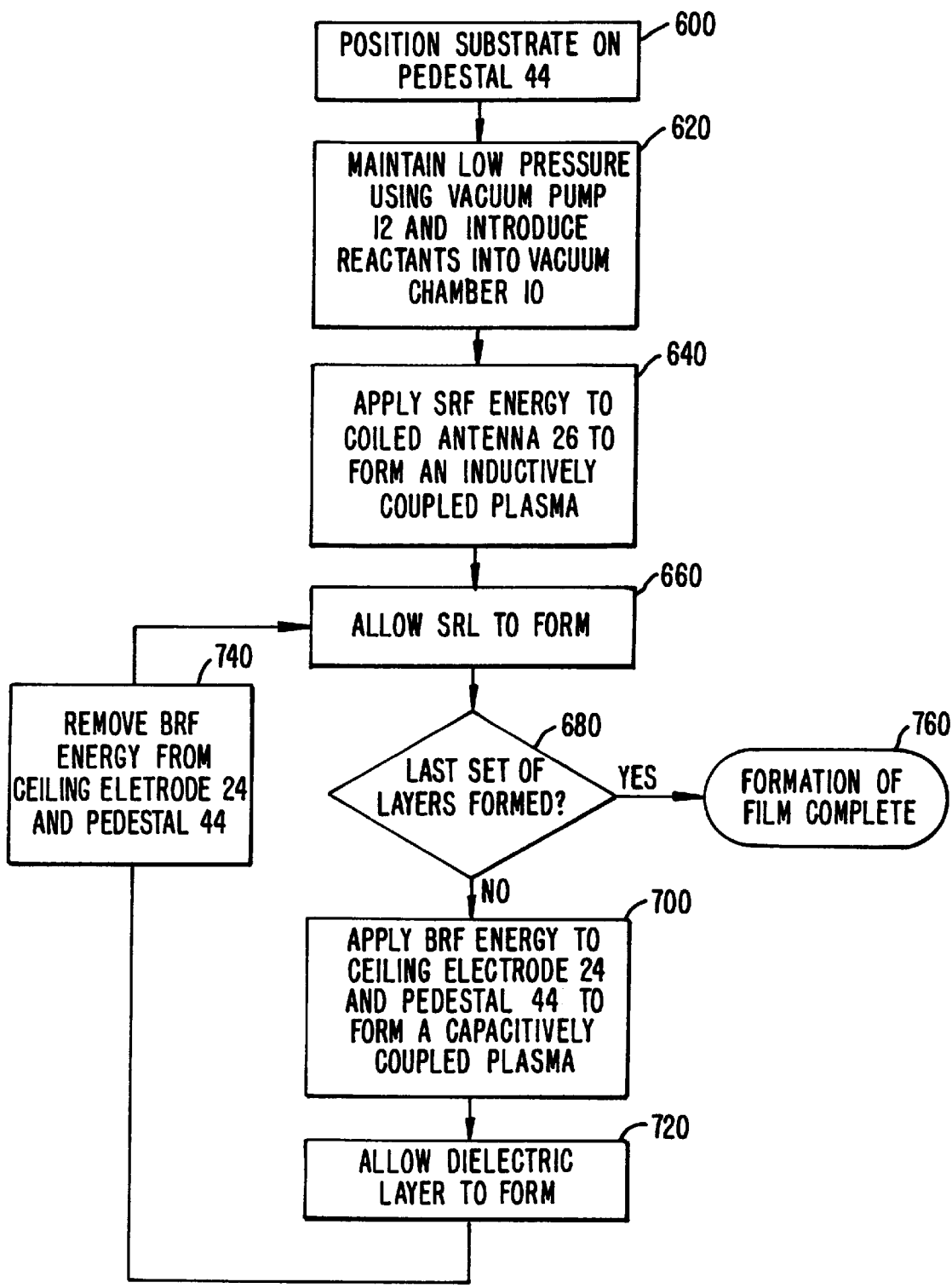
FIG. 5 is a flowchart illustrating steps undertaken in formation of the silicon oxide film deposited in FIG. 4.

The process for creating such sandwiched layered films is shown in FIG. 5. There, the steps of depositing a film's SRL and bulk layer are repeated until the resulting film reaches the requisite number of layers (i.e., the desired film thickness). The steps of FIG. 5 are carried out using the processor 31 and memory 33 shown in FIG. 1. In particular, the processor 31 controls the BRF generators, the SRF generator, the throttle valve, the control valves, switches and other elements in the HDP-CVD system. The memory stores the program which is used by processor 31 to control the process. The combination of the system shown in FIG. 1 with the processor 31 and memory 33 enable the formation of films in the process of FIG. 5. FIG. 5 includes reference numerals relating the process of FIG. 5 to the apparatus of FIG. 1.

To form a film in this manner, the substrate is loaded in vacuum chamber 10 through a vacuum-lock door (not shown), placed onto pedestal 44 (FIG. 5, step 600), and a process gas is introduced into vacuum chamber 10 from gas injection nozzles 14 (step 620). The process gas is a gaseous mixture similar to that mentioned previously. Throttle valve 12a in conjunction with vacuum pump 12 and the introduction of the process gas (step 620) maintain the required pressure within vacuum chamber 10. After processing conditions are set, RF energy is applied to coiled antenna 26 by SRF generator 32 to form an inductive plasma (step 640), creating an SRL (step 660). RF energy is not applied to either ceiling electrode 24 or pedestal 44 during this period. Subsequently, the plasma is excited capacitively by applying RF energy to ceiling electrode 24 and pedestal 44 from BRF generators 36 and 50, respectively (step 700). This deposits a bulk layer on substrate 45 (step 720). RF energy is then removed from ceiling electrode 24 and pedestal 44, allowing another SRL to form (step 740). This deposition of SRL and bulk layers continues until the film reaches the requisite thickness (step 680/760). An advantage of this technique in an HDP-CVD system is that reactants need not be changed, nor is there a need to flush the vacuum chamber. The only action which need be taken is momentarily turning off the BRF sources, thereby performing an SRL deposition step.

III. Exemplary Structure

Figure 6:
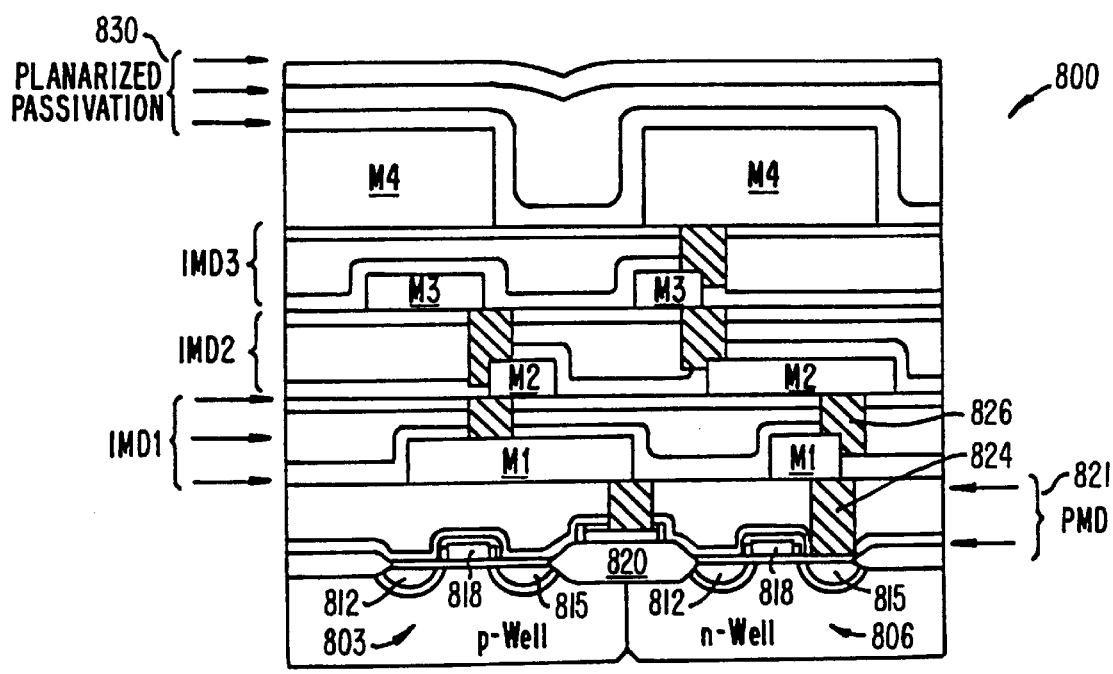
FIG. 6 is a simplified cross-sectional view of an integrated circuit 800 according to the present invention.

Shown in FIG. 6 is a simplified cross-sectional view of an exemplary CMOS integrated circuit 800 which may employ the present invention. As shown, integrated circuit 800 includes NMOS and PMOS transistors 803 and 806, which are separated and electrically isolated from each other by a field oxide region 820 (dielectric layer 180 of FIG. 2). Each transistor 803 and 806 comprises a source region 812, a drain region 815 and a gate region 818. A premetal dielectric (PMD) layer 821 separates transistors 803 and 806 from metal layer M1, with connections between metal layer M1 and the transistors made by contacts 824. Metal layer M1 is one of four metal layers, M1–M4, included in exemplary integrated circuit 800. Each metal layer M1–M4 is separated from adjacent metal layers by respective intermetal dielectric layers IMD1, IMD2 or IMD3. Adjacent metal layers are connected at selected openings by vias 826. Deposited over metal layer M4 are planarized passivation layers 830.

While the SRL of the present invention may find uses in several of the layers shown in integrated circuit 800, its physical properties make it most useful in reducing stress in intermetal dielectric layers IMD1–IMD3, particularly when an HDP-CVD process is used to deposit these layers. It should be understood that the simplified integrated circuit 800 is for illustrative purposes only. One of ordinary skill in the art could implement the present invention in the fabrication of other integrated circuits such as microprocessors, application-specific integrated circuits (ASICs), memory devices and the like. The present invention may also be implemented in the fabrication of integrated circuits using technologies such as BiCMOS, NMOS, bipolar, and others.

IV. Experimental Results

To demonstrate the effectiveness of the method of the present invention, experiments were performed depositing a 0.8 micron thick silicon oxide film according to the method described in FIG. 3. The silicon oxide film was deposited over a low-resistivity silicon substrate in a Centura HDP-CVD Deposition System, manufactured by Applied Materials, Inc. For the experiments, the rate at which silane, oxygen and argon were introduced into the chamber remained constant. Specifically, silane was introduced into the chamber at a rate of 20 sccm; oxygen was introduced into the chamber at a rate of 48 sccm, and argon was introduced at a rate of 20 sccm. The temperature within the vacuum chamber was maintained at 375 degrees Celsius and the pressure within the chamber was maintained at 5 millitorr. An inductively coupled plasma was formed by setting the source RF power (2 MHz) to 3500 Watts. Application of bias RF (BRF) energy was delayed for between 3 and 12 seconds (as noted in Table 1 and FIG. 7). Bias RF power was then applied (1.8 MHz) at 1000 Watts. The results of these experiments are summarized in Table 1 below, and are also depicted graphically in FIG. 7, which plots film stress versus SRL growth time for an 8000 Å thick silicon oxide layer.

TABLE 1

Film Thickness and Stress of an 8000 Å Thick, Silicon Oxide Layer versus SRL Deposition Time

| SRL Deposition Time (seconds) | SRL Thickness (Å) | Average Film Stress ($\times 10^{-9}$ dynes/cm$^2$) |
|---|---|---|
| 0 | 0 | −1.47 |
| 3 | 250 | −1.36 |
| 12 | 1000 | −1.18 |

Figure 7:
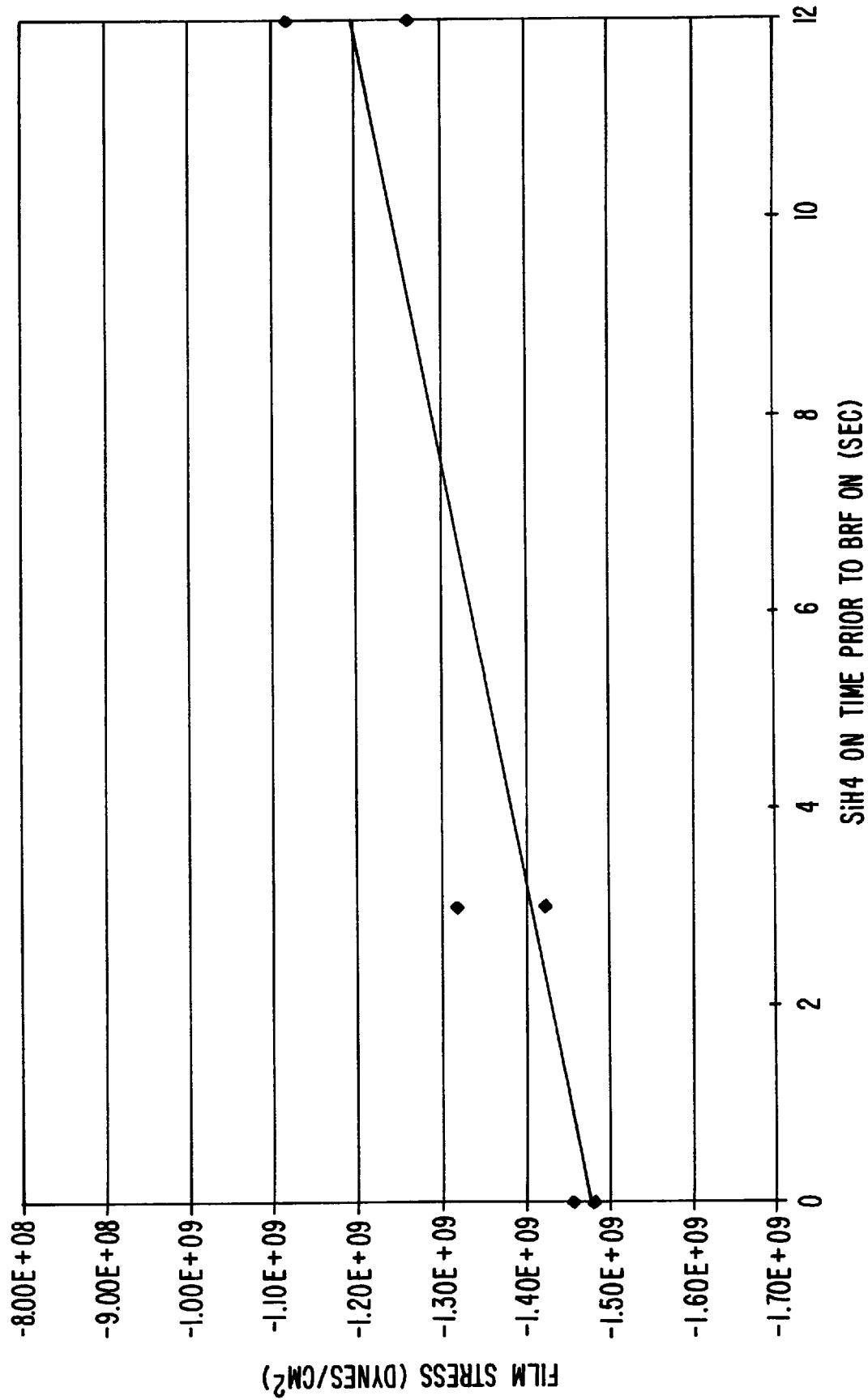
FIG. 7 is a graph depicting film stress as a function of a stress-reducing layer deposition time for films created using the process of the present invention.

As is evident from both Table 1 and FIG. 7, the stress of the deposited film can be controlled by adjusting the thickness of the SRL. In the experiments, the intrinsic stress of the deposited film varied from about $-1.5 \times 10^{-9}$ dynes/cm$^2$ to $-1.1 \times 10^{-9}$ dynes/cm$^2$, depending on the thickness of the deposited SRL (which varied from about 0 to 1000 Å). All stress measurements were taken using known laser techniques which measure the curvature substrate 100 before and after the deposition of a film, and calculate the change in stress from the change in the curvature of substrate 100.

The method of the present invention is not intended to be limited by the specific parameters set forth in the above experiments. A person of ordinary skill in the art will realize that different processing conditions and different reactant sources can be used without departing from the spirit of the invention. Other equivalent or alternative methods of depositing an SRL according to the present invention will be apparent to those skilled in the art. These equivalents and alternatives are intended to be included within the scope of the present invention.

What is claimed is:

1. A process for depositing a film on a substrate disposed in a processing chamber, said process comprising the steps of:

(a) flowing a process gas into the processing chamber;

(b) forming an inductively-coupled plasma from said process gas using only RF energy applied to a coil disposed about the processing chamber;

(c) depositing a first layer of the film over the substrate by maintaining the application of said RF energy for a first period of time;

(d) applying electric energy to a first electrode and a second electrode while maintaining the application of said RF energy, wherein the substrate is disposed on said second electrode; and (e) depositing a second layer of the film over said first layer by maintaining the application of said electric energy and said RF energy for a second period of time.

2. The process of claim 1 wherein said electric energy is RF energy.

3. The process of claim 1 wherein said second time period is at least 10 times longer than said first time period.

4. The process of claim 1 wherein said process gas comprises silicon and oxygen and the film is a silicon oxide film.

5. The process of claim 4, wherein the substrate is maintained at a temperature of between about 200–425° C.

6. The process of claim 4, wherein the processing chamber is maintained at a pressure of between about 1–25 millitorr.

7. The process of claim 4, wherein the substrate is maintained at a temperature of between about 375–400° C. and the processing chamber is maintained at a pressure of between about 4–7 millitorr.

8. The process of claim 2, wherein the application of said electric energy to said first and said second electrodes is delayed between about 1 to 100 seconds while the application of RF energy to said coil is maintained.

9. The process of claim 8, wherein the application of said electric energy to said first and said second electrodes is delayed between about 5 to 20 seconds while the application of RF energy to said coil is maintained.

10. The process of claim 1 wherein said first and said second periods of time are such that said first layer is deposited to a thickness of between about 1 to 15 percent of the thickness to which said second layer is deposited.

11. The process of claim 1 wherein said first and said second periods of time are each of such a duration that said film is deposited to a first thickness of about 1.0 micron or less and said first layer is deposited to a second thickness of about 0.15 microns or less.

12. The process of claim 1 wherein said process gas comprises silane and oxygen.

13. The process of claim 12 wherein said process gas further comprises argon.

14. In a high-density plasma chemical vapor deposition processing system having a processing chamber, a first electrode, a second electrode, and a coil disposed about the processing chamber, a process for depositing a film on a substrate disposed on the second electrode, said process comprising the steps of:

(a) flowing a process gas into the processing chamber;

(b) forming an inductively-coupled plasma from said process gas using only RF energy applied to the coil;

(c) depositing a first layer of the film over the substrate by maintaining the application of said RF energy;

(d) applying electric energy to the first and the second electrodes, while maintaining the application of said RF energy; and (e) depositing a second layer of the film over said first layer by maintaining the application of said electric energy and said RF energy.

15. The process of claim 14 further comprising the steps of:

(f) depositing a third layer of the film over said second layer by maintaining the application of said RF energy and discontinuing the application of said electric energy;

(g) reapplying said electric energy to the first and the second electrodes, while maintaining the application of said RF energy;

(h) depositing a fourth layer of the film over said third layer by maintaining the application of said electric energy and said RF energy;

(i) repeating steps (f), (g) and (h) iteratively until a selected thickness of the film is reached.

16. A process for depositing a film on a substrate disposed in a substrate processing chamber, said process comprising:

a) flowing a process gas into said substrate processing chamber;

b) forming an inductively-coupled plasma from said process gas;

c) thereafter, maintaining said plasma to deposit a first layer of said film over said substrate without biasing said plasma toward said substrate; and d) thereafter, maintaining said plasma and biasing said plasma toward said substrate to deposit a second layer of said film over said first layer.

17. The process of claim 16 wherein said process gas comprises reactant gases and argon and wherein said biasing promotes a sputtering effect on said second layer as said second layer is deposited.

18. The process of claim 17 wherein said reactant gases comprise silane and oxygen.

19. The process of claim 16 wherein said biasing is done by applying RF energy to at least one of two capacitively-coupled electrodes.

20. The process of claim 19 wherein said substrate is disposed over a first of said at least two electrodes and said biasing applies RF energy to said first electrode.

21. A process for depositing a film on a substrate disposed in a substrate processing chamber, said process comprising:

a) flowing a process gas into said substrate processing chamber;

b) forming a plasma from said process gas;

c) thereafter, maintaining said plasma to deposit a first layer of said film over said substrate without biasing said plasma toward said substrate; and d) thereafter, maintaining said plasma and biasing said plasma toward said substrate to deposit a second layer of said film over said first layer.

* * * * *